(12) United States Patent
Moon et al.

(10) Patent No.: US 10,414,657 B2
(45) Date of Patent: Sep. 17, 2019

(54) METHOD FOR PREPARING GRAPHENE AND SAID GRAPHENE, ELECTRONIC DEVICE USING SAID GRAPHENE

(71) Applicant: LG ELECTRONICS INC., Seoul (KR)

(72) Inventors: Jinsan Moon, Seoul (KR); Kyungho Jung, Seoul (KR); Eunseck Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 90 days.

(21) Appl. No.: 14/435,689

(22) PCT Filed: Sep. 26, 2013

(86) PCT No.: PCT/KR2013/008625
§ 371 (c)(1),
(2) Date: Apr. 14, 2015

(87) PCT Pub. No.: WO2014/077503
PCT Pub. Date: May 22, 2014

(65) Prior Publication Data
US 2015/0266740 A1    Sep. 24, 2015

(30) Foreign Application Priority Data

Nov. 14, 2012  (KR) .................. 10-2012-0128662

(51) Int. Cl.
*C01B 32/182*  (2017.01)
*B05D 3/00*  (2006.01)
(Continued)

(52) U.S. Cl.
CPC ............ *C01B 32/184* (2017.08); *B82Y 40/00* (2013.01); *H01L 21/02491* (2013.01);
(Continued)

(58) Field of Classification Search
CPC ...................... C01B 31/0446; B05D 3/007
(Continued)

(56) References Cited

U.S. PATENT DOCUMENTS

2003/0090199 A1*  5/2003  Saita .................. C04B 41/009
                                                    313/509
2009/0146111 A1    6/2009  Shin et al.
(Continued)

FOREIGN PATENT DOCUMENTS

CN    101764051 A    6/2010
CN    102337513 A    2/2012
(Continued)

OTHER PUBLICATIONS

Wen, J., Wilkes, G. L., Organic/Inorganic Hybrid Network Materials by the Sol-Gel Approach, 1996, Chemistry of Materials, vol. 8, issue 8, 1667-1681.*
(Continued)

*Primary Examiner* — Dah-Wei D. Yuan
*Assistant Examiner* — Hai Y Zhang
(74) *Attorney, Agent, or Firm* — Birch, Stewart, Kolasch & Birch, LLP

(57) ABSTRACT

The present invention relates to graphene, and particularly, to a method for preparing graphene, to said graphene, and to an electronic device using said graphene. The present invention, as described above, can be constructed by the inclusion of the steps of: forming a graphene layer on a catalytic metal layer; forming an organic-inorganic hybrid film in an uncured state on the graphene layer; and curing the film.

6 Claims, 8 Drawing Sheets

(51) Int. Cl.
*C01B 32/184* (2017.01)
*H01L 21/02* (2006.01)
*B82Y 40/00* (2011.01)

(52) U.S. Cl.
CPC . *H01L 21/02527* (2013.01); *Y10T 428/24917* (2015.01); *Y10T 428/30* (2015.01)

(58) Field of Classification Search
USPC .................................. 427/384; 428/209, 408
See application file for complete search history.

(56) References Cited

U.S. PATENT DOCUMENTS

| | | | |
|---|---|---|---|
| 2011/0041980 A1* | 2/2011 | Kim ...................... | H01L 51/441 156/60 |
| 2011/0123776 A1 | 5/2011 | Shin et al. | |
| 2011/0195207 A1* | 8/2011 | Hong ...................... | C23C 16/26 428/34.1 |
| 2011/0308717 A1* | 12/2011 | Cho ...................... | B32B 37/025 156/249 |
| 2012/0282419 A1 | 11/2012 | Ahn et al. | |
| 2012/0286264 A1* | 11/2012 | Suzuki ................ | H01L 27/1225 257/43 |
| 2013/0134384 A1 | 5/2013 | Won et al. | |

FOREIGN PATENT DOCUMENTS

| | | |
|---|---|---|
| CN | 102491315 A | 6/2012 |
| CN | 102592964 A | 7/2012 |
| KR | 10-2011-0053012 A | 5/2011 |
| KR | 10-2011-0084110 A | 7/2011 |
| KR | 10-2011-0122524 A | 11/2011 |
| KR | 10-2012-0015185 A | 2/2012 |
| KR | 10-1113590 B1 | 2/2012 |

OTHER PUBLICATIONS

CN102491315A English translation. (Year: 2018).*
CN101764051A English translation. (Year: 2018).*
KR101113590B1 English translation. (Year: 2018).*
Watcharotone et al., "Graphene-Silica Composite Thin Films as Transparent Conductors," NANO Letters, 2007, vol. 7, No. 7, pp. 1888-1892.

* cited by examiner

METHOD FOR PREPARING GRAPHENE AND SAID GRAPHENE, ELECTRONIC DEVICE USING SAID GRAPHENE

TECHNICAL FIELD

The present invention relates to graphene, more particularly, to a method of preparing graphene, graphene prepared thereby, and an electronic device using the graphene.

BACKGROUND ART

As materials composed of carbon atoms, there are fullerenes, carbon nanotubes, graphene, graphite, and the like. Among the materials, graphene is composed of a one atom thick layer in which carbon atoms are arranged on a two-dimensional plane.

In particular, graphene has extremely stable and excellent electrical, mechanical, and chemical characteristics. In addition, graphene which is a superior conductive material may transport electrons much faster than silicon and permits migration of greater current than copper. Such characteristics were confirmed through experimentation after a method of isolating graphene from graphite was discovered in 2004. In this regard, research is being actively carried out.

Such graphene may be formed in a large area and has electrical, mechanical, and chemical stability. In addition, due to excellent conductivity, graphene receives attention as a base material of an electronic circuit.

In addition, since electrical characteristics of graphene may be changed according to crystal orientation of graphene having a general thickness, users may express electrical characteristics to a selected direction and, as such, a device may be easily designed. Therefore, graphene may be effectively used in carbon based electronic or electromagnetic devices and the like.

DISCLOSURE

Technical Problem

An object of the present invention devised to solve the problem lies in a method of preparing graphene such that characteristics of graphene are protected and improved during processes of transferring and applying graphene, graphene prepared thereby, and an electronic device using the graphene.

Technical Solution

The object of the present invention can be achieved by providing a method of preparing graphene, the method including forming a graphene layer on a catalyst metal layer, forming an organic-inorganic hybrid film, which is not cured, on the graphene layer, and curing the film.

In another aspect of the present invention, provided herein is a method of preparing graphene, the method including forming a sol-gel hybrid film on the graphene layer.

In another aspect of the present invention, provided herein is an electronic device including graphene including an organic-inorganic hybrid film and a graphene layer located on the film.

Advantageous Effects

First, by an organic-inorganic hybrid film, functions of a transfer film and a substrate may be provided at the same time. Accordingly, the film may be used in a transparent electrode form.

In addition, by using the organic-inorganic hybrid film which may have functions similar to those of glass, problems occurring during a process that a graphene layer is transferred to glass may be resolved.

Furthermore, a transparent electrode structure having high strength and flexibility, which may be bent, while maintaining high strength, may be manufactured.

Technical effects of the present invention are not limited to those referred to above and other technical effects which are not referred to herein will be understood by those of ordinary ski in the art.

DESCRIPTION OF DRAWINGS

FIG. 10 is a conceptual view illustrating a hydrolysis reaction.

FIG. 11 is a conceptual view illustrating condensation reaction.

FIG. 12 is a conceptual view illustrating a polymerization reaction.

BEST MODE

Figure 1:
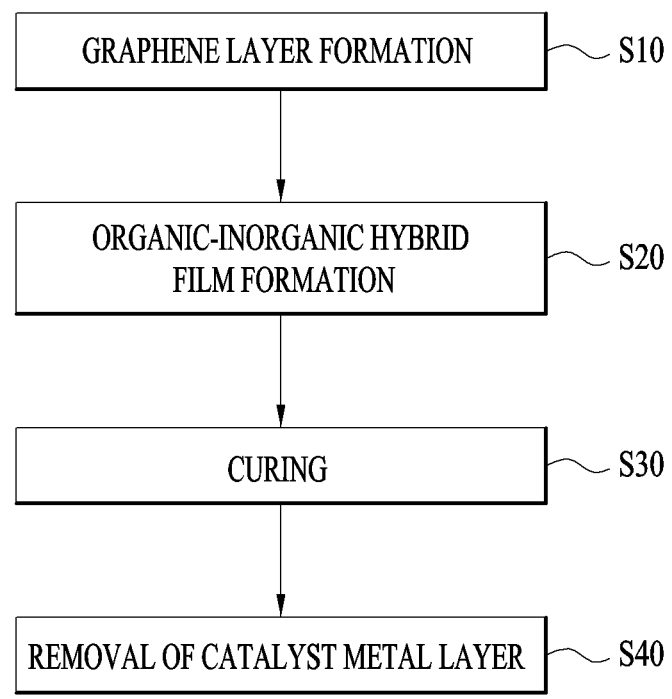
FIG. 1 is a flowchart illustrating an embodiment to prepare graphene.

The present invention will now be described more fully with reference to the accompanying drawings, in which exemplary embodiments of the invention are shown.

While the invention is susceptible to various modifications and alternative forms, specific embodiments thereof are shown by way of example in the drawings and will herein be described in detail. It should be understood, however, that there is no intent to limit the invention to the particular forms disclosed. On the contrary, the invention is to cover all modifications, equivalents, and alternatives falling within the spirit and scope of the invention as defined by the claims.

It will be understood that when an element, such as a layer, a region, or a substrate, is referred to as being "on" another element, it may be directly on, connected or coupled to the other element or intervening elements may be present.

It will be understood that, although the terms first, second, third etc. may be used herein to describe various elements, components, regions, layers and/or sections, these elements, components, regions, layers and/or sections should not be limited by these terms.

FIG. 1 is a flowchart illustrating an embodiment of a method of preparing graphene. Hereinafter, the present invention now will be described with reference to FIG. 1 and the accompanying drawings.

Figure 2:
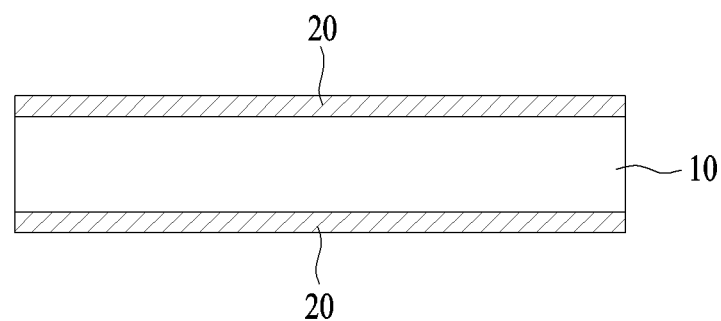
FIG. 2 is a sectional view illustrating an embodiment of a graphene layer formed on a catalyst metal layer.

As illustrated in FIGS. 1 and 2, as an embodiment for graphene formation, a graphene layer 20 is formed on a catalyst metal layer 10 (S10).

The catalyst metal layer 10 may use a metal such as Ni, Co, Fe, Pt, Au, Al, Cr, Cu, Mg, Mn, Mo, Rh, Si, Ta, Ti, W, U, V, Zr, or the like. A single layer composed of any one among the metals or an alloy composed of two metals or more among the metals may be used.

As a method of forming the graphene layer 20, thermal-chemical vapor deposition (CVD), inductively coupled plasma assisted chemical vapor deposition (ICP-CVD), plasma enhanced chemical vapor deposition (PE-CVD), chemical vapor deposition such as microwave CVD or the like, or the like may be used. In addition, a variety of methods such as rapid thermal annealing (RTA), atomic layer deposition (ALD), physical vapor deposition (PVD), and the like may be used.

Figure 3:
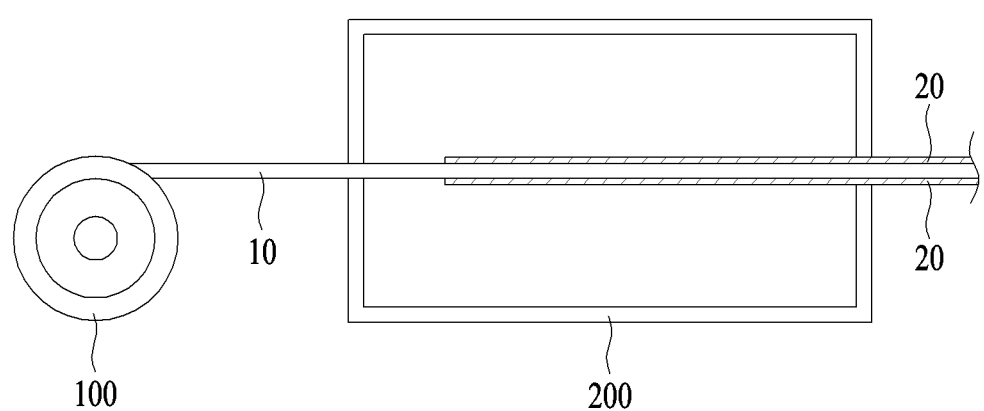
FIG. 3 is a schematic view illustrating an embodiment of a device to form a graphene layer.

FIG. 3 illustrates an embodiment of forming the graphene layer 20 on the catalyst metal layer 10 using chemical vapor deposition (CVD).

Chemical vapor deposition is method of growing the graphene layer 20 by locating the catalyst metal layer 10 in a chamber 200 and inserting a carbon source into the chamber 200 to provide proper growth conditions.

For example, the carbon source may be supplied in a gas form such as methane ($CH_4$), acetylene ($C_2H_2$), or the like. In addition, the carbon source may be supplied in a solid form such as a polymer, or the like, or in a liquid form such as bubbling alcohol or the like.

In addition, a carbon source such as ethane, ethylene, ethanol, acetylene, propane, butane, butadiene, pentane, pentene, cyclopentadiene, hexane, cyclohexane, benzene, toluene, or the like may be used.

Hereinafter, an embodiment using copper (Cu) as the catalyst metal layer 10 and methane ($CH_4$) as a carbon source will be described.

When, on the catalyst metal layer 10, methane gas is added under hydrogen atmosphere while maintaining a proper temperature, hydrogen and methane react and, as such, the graphene layer 20 is formed on the catalyst metal layer 10. Formation of the graphene layer 20 may be performed at approximately 300 to 1500° C.

In this regard, when space is not present in a lower face of the catalyst metal layer 10, the graphene layer 20 may be formed only on an upper face of the catalyst metal layer 10. However, when space is present in a lower face of the catalyst metal layer 10, the graphene layer 20 may formed on both faces of the catalyst metal layer 10, as illustrated in FIG. 2.

Since copper as the catalyst metal layer 10 has low solubility in carbon, it is advantageous to form mono-layer graphene. The graphene layer 20 may be directly formed on the catalyst metal layer 10.

The catalyst metal layer 10 may be supplied in a sheet form. In addition, the catalyst metal layer 10 may be continuously supplied in a form wound around a first roller 100 as illustrated in FIG. 3 and may be used in a copper foil form having a thickness of approximately 10 to 10 mm.

When the graphene layer 20 formed according to the process described above is formed on both faces of the catalyst metal layer 10 as illustrated in FIG. 2, the graphene layer 20 formed on one face of the catalyst metal layer 10 may be removed.

Figure 4:
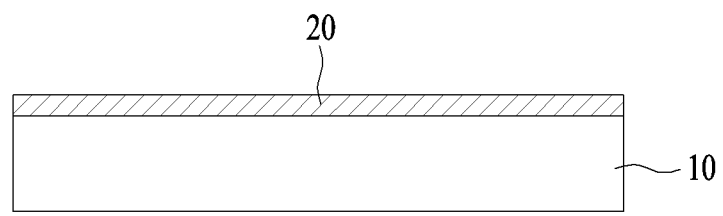
FIG. 4 is a sectional view illustrating an embodiment of a graphene layer formed on one face of a catalyst metal layer.

According to such a process, as illustrated in FIG. 4, the graphene layer 20 may be formed on one face of the catalyst metal layer 10.

Figure 5:
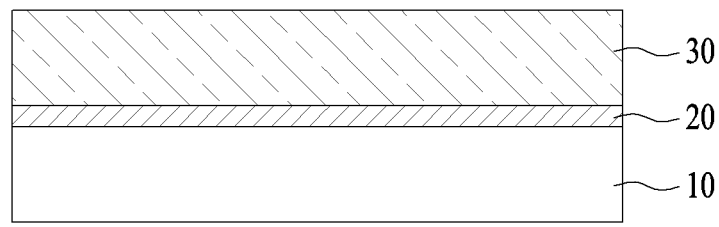
FIG. 5 is a sectional view illustrating an embodiment of an organic-inorganic hybrid film, which is not cured, formed on a graphene layer.

Subsequently, as illustrated in FIG. 5, an organic-inorganic hybrid film 30 is formed on the graphene layer 20 formed on one face of the catalyst metal layer 10.

As the organic-inorganic hybrid film 30, an organic-inorganic complex material, which may be subsequently cured by heat or light irradiation, may be used. According to material types, curing may be performed using an initiator.

As an embodiment, a sol-gel hybrid material may be used.

Generally, inorganic materials have high strength and hardness, a small free volume, and high glass transition temperature (Tg).

Meanwhile, hydrocarbon based polymers as organic materials have characteristics as a monomer but form a linear or network structure due to due to crosslinking through chemical reaction.

The organic materials generally have large free volume and low transition temperature due to molecular motion of hydrocarbon based polymers.

Sol-gel hybrid materials may have all advantages of the inorganic materials and the organic material. That is, high thermal stability, strength, hardness, and other functions of inorganic materials, and flexibility, toughness, and, other functions of the organic materials may be realized at the same time.

Figure 6:
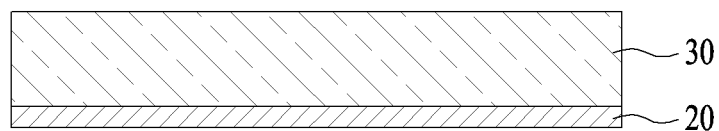
FIG. 6 is a sectional view illustrating an embodiment of an organic-inorganic hybrid film, which is cured, formed on a graphene layer.

Next, as illustrated in FIG. 6, such an organic-inorganic hybrid is cured (S30). The curing process may be carried out through polymerization reaction of the organic-inorganic hybrid material.

As described above, the curing process may be carried out through ultraviolet (UV) irradiation. In addition, the curing process may be surely carried out by heat or other methods.

By the curing process, organic materials of the organic-inorganic hybrid film 30 are cross-linked through polymerization reaction and, as such, a cured film 31 is formed. Such a curing process will be described below.

Figure 7:
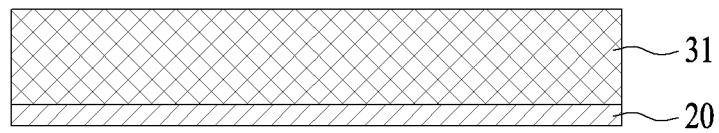
FIG. 7 is a sectional view illustrating an embodiment in which a catalyst metal layer is removed.

Next, as illustrated in FIG. 7, the graphene layer 20 adhered to the cured film 31 remains by removing the catalyst metal layer 10 (S40).

The organic-inorganic hybrid film 31 as cured described above has advantages of organic materials and inorganic materials, as described above, and, thus, may be intactly used as a substrate of a variety of electronic devices.

That is, the organic-inorganic hybrid films 30 and 31 are layers which may be intactly combined with the graphene layer 20 in a variety of electronic devices or may be used as a part of the electronic devices.

For example, the organic-inorganic hybrid films 30 and 31 may be transparent or opaque substrates which may be directly used in a variety of display devices and may be substrates which may be directly used in devices such as touch panels.

In addition, the films 30 and 31 may be substrates which may be used in a variety of devices such as solar cells, electronic paper, transparent electronic devices, flexible devices, and the like.

In addition, in conventional graphene preparation processes, a transfer film such as a thermal transfer film was used so as to move the graphene layer 20 to a substrate of an electronic device. However, during the transfer process, graphene was damaged in some cases.

That is, through such a process, the graphene layer was transferred to a substrate such as a synthetic resin substrate composed of PET or a polymer. However, the thickness of the synthetic resin substrate is limited and transfer characteristics thereof are not satisfactory in inorganic materials such as glass substrates.

However, the organic-inorganic hybrid films 30 and 31 as described above may have functions of a transfer film and a substrate at the same time. Accordingly, the organic-inorganic hybrid films 30 and 31 may be directly used in a transparent electrode form.

In addition, by using the organic-inorganic hybrid films 30 and 31 which may have characteristics similar to glass, problems which occur in a process of transferring the graphene layer 20 may be resolved.

In addition, a high strength transparent electrode structure having flexibility, which may be bent, while maintaining high strength may be prepared.

Meanwhile, in some cases, the process of removing the catalyst metal layer 10 (S40) as described above may be carried out before the curing process (S30).

Figure 8:
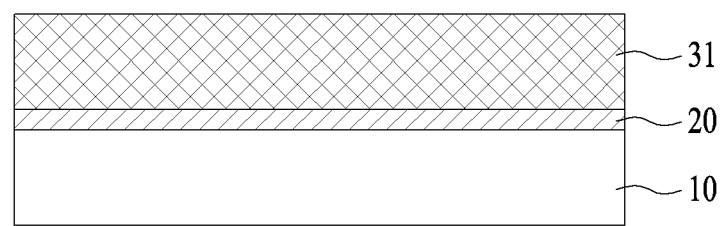
FIG. 8 is a sectional view illustrating an embodiment wherein a catalyst metal layer is removed before curing.

That is, as illustrated in FIG. 8, the curing process (S30) may be carried out after removing the catalyst metal layer 10 using a method such as etching.

A state cured after removing the catalyst metal layer 10 may be identical to that illustrated in FIG. 7.

Figure 9:
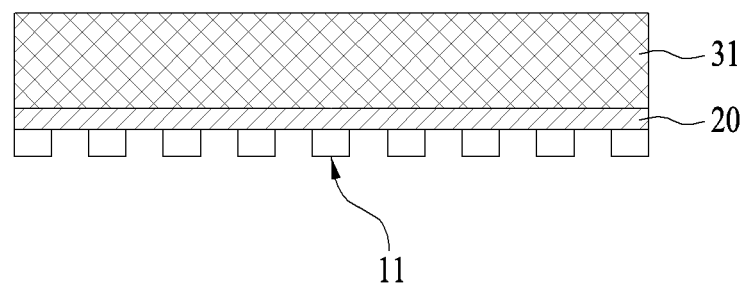
FIG. 9 is a sectional view illustrating an embodiment in which a metal pattern is formed using a catalyst metal layer.

In addition, as illustrated in FIG. 9, a pattern structure 11, in which the catalyst metal layer 10 is not completely removed through etching and is partially removed through patterning, may be used as an electrode structure or a portion of the electrode structure.

Hereinafter, reaction processes of the organic-inorganic hybrid films 30 and 31 described above will be described in detail. For example, sol-gel reaction will be described.

Figure 10:
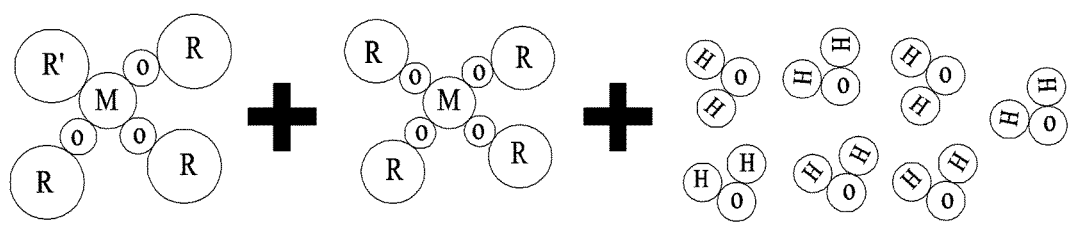
FIGS. 10 to 12 are conceptual views illustrating embodiments of sol-gel reaction.
Figure 10:
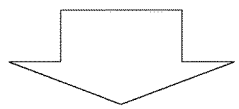
Figure 10:
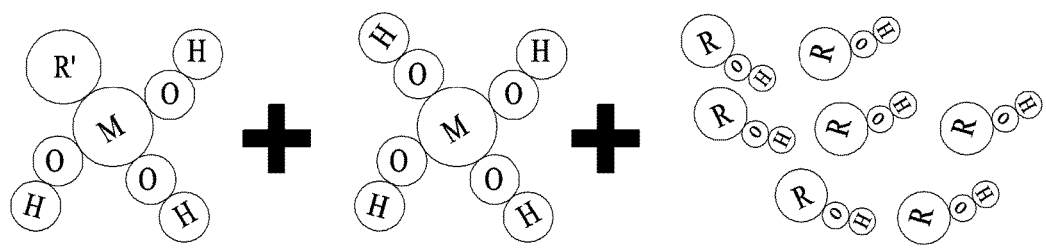

First, hydrolysis reaction of a process illustrated in FIG. 10 is carried out.

In sol-gel reaction, first, a start material, R(—OCH$_3$), is hydrolyzed by water. Such a process is required to change —OCH$_3$, which does not have reactivity, into an OH group having high reactivity.

When water and a catalyst are added, through a reaction formula "H$_2$O+OCH$_3$→OH+CH$_3$OH (alcohol)", alcohol is generated and a precursor is substituted to a OH group. Accordingly, such a process is called hydrolysis or alcoholysis.

In FIG. 10, R means an organic group. The organic group may be a material composed of carbon (C). For example, —CH$_3$, —C$_2$H$_5$, or the like may be used. In addition, R' generally means an organic functional group. The organic functional group means a material which may have reactivity because of an initiator and an external stimulus such as heat or light. For example, an epoxy group, acrylic group, amine group, isocyanate group, or the like may be used.

In addition, M means a metal or metalloid such as silicon (Si). As sol-gel reaction, reaction using a precursor having Si is generally used. Here, M is not limited to Si and may be mainly a transition metal. In addition, aluminum (Al), zirconium (Zr), titanium (Ti), or the like may be used.

Figure 11:
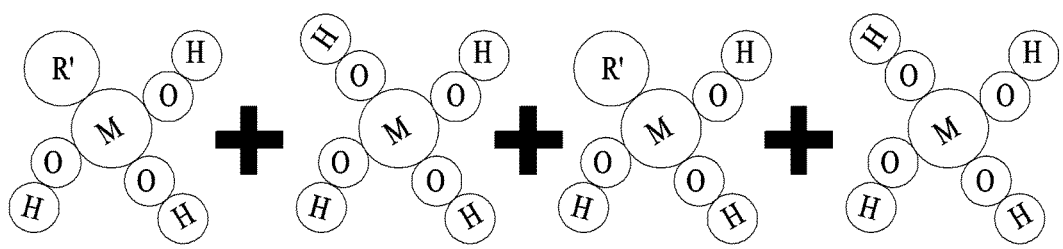
Figure 11:
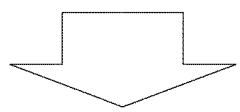
Figure 11:
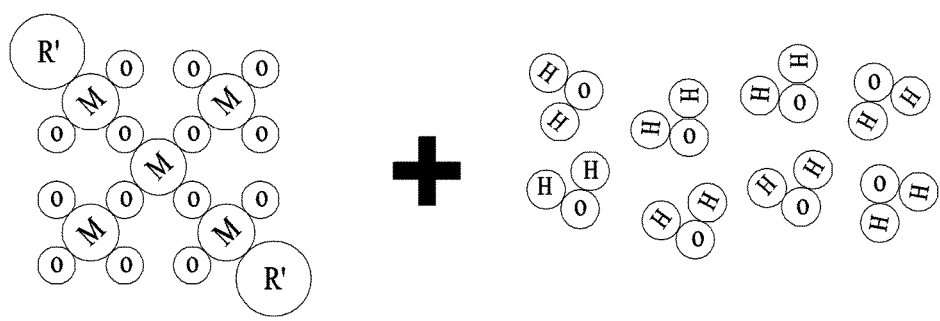

Next, as illustrated in FIG. 11, condensation reaction occurs between OH groups having high reactivity. That is, binding between precursors is performed by water generated through a reaction formula such as "—OH+—OH→0+ H$_2$0". Such reaction is called condensation.

Figure 12:
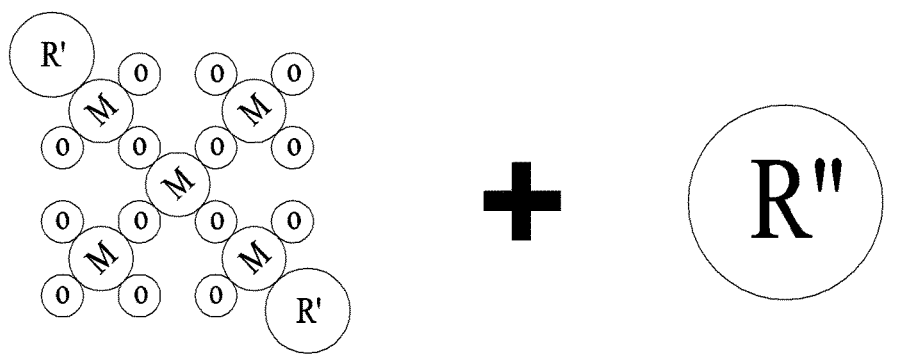
Figure 12:
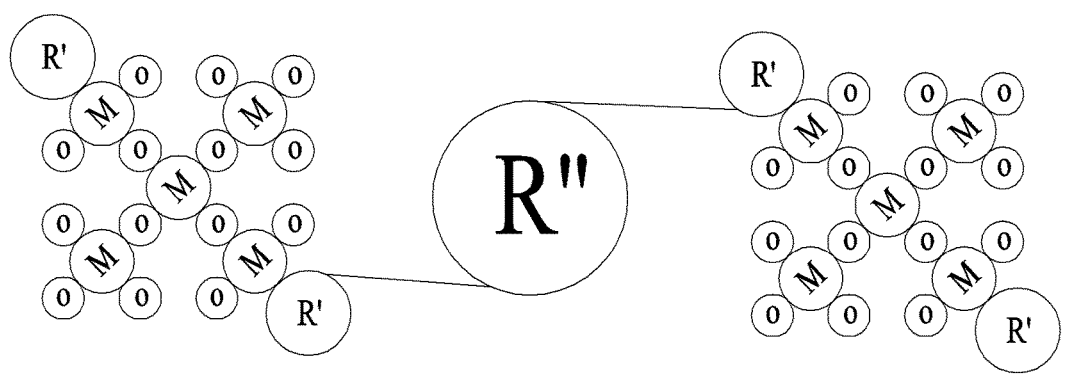

As another condensation (curing) reaction illustrated in FIG. 12, condensation may be performed through the polymerization reaction between functional groups described above. Epoxy or acrylic may be condensed by a proper initiator and heat or light.

In FIG. 12, R" generally means epoxy, which is not a metal precursor, and a polymer monomer, having a functional group. The functional group is not limited to those described above and may be any organic functional group.

When the sol-gel process is used, a material having inorganic and organic characteristics at the same time at low temperature may be prepared. In addition, properties of the material may be easily controlled according to organic functional group types and cured states and the material may be molded in a variety of shapes.

As described above, when the process of forming the organic-inorganic hybrid film, which is not cured, is applied to a sol-gel process, the polymerization reaction in the condensation reaction described above is not completely performed and an intermediate state may be formed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

By using an organic-inorganic hybrid film having characteristics similar to those of glass, problems which may occur during a process of transferring a graphene layer to glass may be resolved.

Accordingly, a high strength transparent electrode structure having flexibility, which may be bent, while maintaining high strength may be manufactured.

The invention claimed is:

1. A method of preparing graphene, the method comprising:
   supplying a catalyst metal layer continuously in a form wound around a roller;
   forming a graphene layer on the catalyst metal layer;
   forming a sol-gel hybrid film, which is not cured, on the graphene layer, wherein the sol-gel hybrid film includes a sol-gel hybrid material, and wherein the sol-gel hybrid material includes a precursor having a metal or a metalloid;
   curing the sol-gel hybrid film; and
   patterning the catalyst metal layer through etching such that the catalyst metal layer is partially removed through the patterning and forms an electrode structure or a portion of the electrode structure before and after the curing of the sol-gel hybrid film, such that the graphene layer adhered to the cured sol-gel hybrid film remains between the patterned catalyst metal layer and the cured sol-gel hybrid film,
   wherein the curing of the sol-gel hybrid film is performed such that the sol-gel hybrid film has functions of a transfer film and a substrate, and
   wherein the graphene layer contacts the cured sol-gel hybrid film.

2. The method according to claim 1, wherein the curing of the sol-gel hybrid film is performed through polymerization reaction.

3. The method according to claim 1, wherein the sol-gel hybrid film is used as a transparent substrate after the curing.

4. The method according to claim 1, wherein the sol-gel hybrid material includes a precursor having Si.

5. The method according to claim 1, wherein the curing of the sol-gel hybrid film is performed to form a transparent electrode structure.

6. The method according to claim 1, wherein the forming of the graphene layer is performed directly on the catalyst metal layer.

* * * * *